United States Patent
Lin et al.

(10) Patent No.: US 9,748,220 B1
(45) Date of Patent: Aug. 29, 2017

(54) GATE-BOUNDED SILICON CONTROLLED RECTIFIER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chun-Yu Lin, Hsinchu (TW); Ming-Dou Ker, Hsinchu County (TW); Wen-Tai Wang, Hsinchu County (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/397,741

(22) Filed: Jan. 4, 2017

(30) Foreign Application Priority Data

Aug. 31, 2016 (CN) .......................... 2016 1 0785746

(51) Int. Cl.
| | |
|---|---|
| *H01L 29/74* | (2006.01) |
| *H01L 27/02* | (2006.01) |
| *H01L 29/06* | (2006.01) |
| *H01L 29/423* | (2006.01) |
| *H01L 29/10* | (2006.01) |

(52) U.S. Cl.
CPC ...... *H01L 27/0262* (2013.01); *H01L 29/0649* (2013.01); *H01L 29/1095* (2013.01); *H01L 29/42304* (2013.01)

(58) Field of Classification Search
CPC .......... H01L 29/1095; H01L 29/42304; H01L 29/0649; H01L 27/0262
See application file for complete search history.

(56) References Cited

U.S. PATENT DOCUMENTS

2009/0189183 A1* 7/2009 Hung .................. H01L 29/7455
257/173

FOREIGN PATENT DOCUMENTS

| | | |
|---|---|---|
| CN | 104269396 A | 1/2015 |
| TW | 449788 B | 8/2001 |
| TW | 503567 B | 9/2002 |

* cited by examiner

Primary Examiner — (Vikki) Hoa B Trinh
(74) Attorney, Agent, or Firm — CKC & Partners Co., Ltd.

(57) ABSTRACT

A gate-bounded silicon controlled rectifier includes a substrate, an N-type well region, a P-type well region, a first N-type semiconductor region, a first P-type semiconductor region, a second N-type semiconductor region, a second P-type semiconductor region and a third semiconductor region. The N-type well region and the P-type well region are disposed in the substrate. The first N-type semiconductor region is disposed in the N-type well region. The first P-type semiconductor region is disposed in the P-type well region. The second N-type semiconductor region is disposed in the P-type well region and located between the first N-type semiconductor region and the first P-type semiconductor region. The second P-type semiconductor region is disposed in the N-type well region and located between the first N-type semiconductor region and the first P-type semiconductor region. The third semiconductor region is located between the second N-type semiconductor region and the second P-type semiconductor region.

9 Claims, 4 Drawing Sheets

GATE-BOUNDED SILICON CONTROLLED RECTIFIER

RELATED APPLICATIONS

This application claims priority to Chinese Application Serial Number 201610785746.7, filed Aug. 31, 2016, which is herein incorporated by reference.

BACKGROUND

Field of Invention

The present disclosure relates to an electrostatic protection element. More particularly, the present disclosure relates to a gate-bounded silicon controlled rectifier.

Description of Related Art

When sizes of transistors in the integrated circuit (IC) are gradually reduced, an issue is created in which elements may be damaged or destroyed by electrostatic discharge becomes increasingly important. A silicon controlled rectifier (SCR) formed by a parasitic PNP bipolar junction transistor and a parasitic NPN bipolar junction transistor is the most common electrostatic-discharge protection element. With respect to other electrostatic-discharge protection elements, the silicon controlled rectifier has a lower holding voltage, which can afford higher electrostatic-discharge energy in a smaller layout area, but also results in latch up without warning when the silicon controlled rectifier operates in a normal circuit. The integrated circuit may be unable to operate or be destroyed by such latch up.

Accordingly, a significant challenge is related to ways in which to achieve the electrostatic-discharge protection while at the same time avoiding the occurrence of the latch up associated with designing silicon controlled rectifiers.

SUMMARY

An aspect of the present disclosure is directed to a gate-bounded silicon controlled rectifier. The gate-bounded silicon controlled rectifier includes a substrate, an N-type well region, a P-type well region, a first N-type semiconductor region, a first P-type semiconductor region, a second N-type semiconductor region, a second P-type semiconductor region, a third semiconductor region. The N-type well region is disposed in the substrate. The P-type well region is disposed in the substrate. A junction is located between the P-type well region and the N-type well region. The first N-type semiconductor region is connected to a first pin, and the first N-type semiconductor region is disposed in the N-type well region. The first P-type semiconductor region is connected to a second pin, and the first P-type semiconductor region is disposed in the P-type well region. The second N-type semiconductor region is connected to the second pin, and the second N-type semiconductor region is disposed in the P-type well region and located between the first N-type semiconductor region and the first P-type semiconductor region. The second P-type semiconductor region is connected to the first pin, and the second P-type semiconductor region is disposed in the N-type well region and located between the first N-type semiconductor region and the first P-type semiconductor region. The third semiconductor region is located between the second N-type semiconductor region and the second P-type semiconductor region. The first pin and the second pin are respectively connected to an anode and a cathode.

It is to be understood that the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
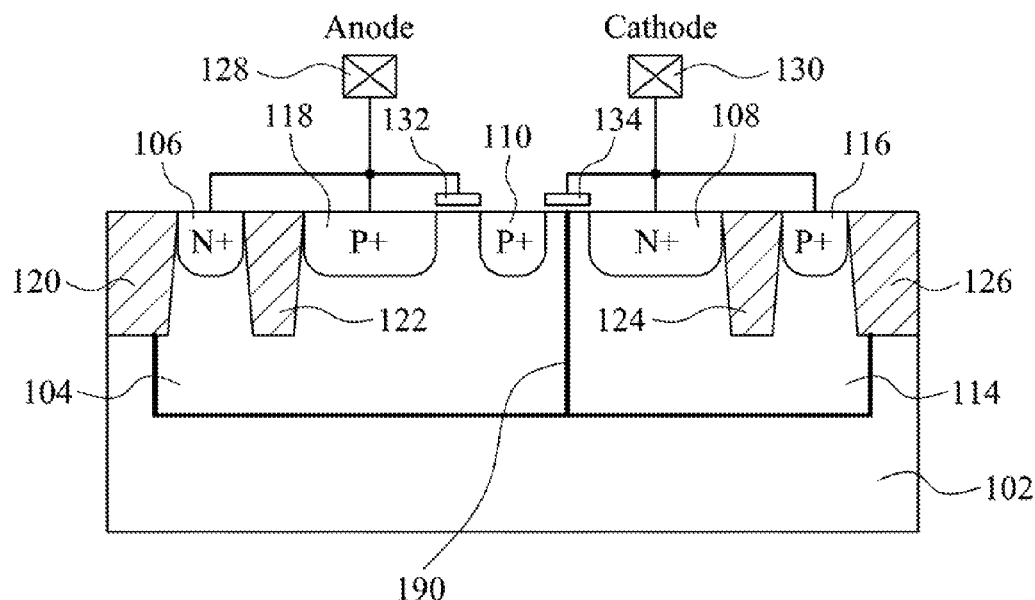
FIG. 1 is a schematic diagram of a gate-bounded silicon controlled rectifier according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition; the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below" "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a gate-bounded silicon controlled rectifier according to a first embodiment of the present disclosure. As shown in FIG. 1, a gate-bounded silicon controlled rectifier 100 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 110, a first isolation trench 120, a second isolation trench 126, a third isolation trench 122, a fourth isolation trench 124, a anode 128, a cathode 130, a first gate structure 132 and a second gate structure 134.

In the first embodiment of the present disclosure, the N-type well region 104 and the P-type well region 114 are disposed in the P-type substrate 102, and a junction 190 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104, and located between the first N-type semiconductor region 106 and the first P-type semiconductor region 116. The third semiconductor region 110 is located between the second N-type semiconductor region 108 and the second P-type semiconductor region 118, and disposed in the N-type well region 104. The third semiconductor region 110 represents a P-type semiconductor region.

In this embodiment, the first gate structure 132 is connected to the anode 128, and the gate structure 132 is disposed over an interval between the second P-type semiconductor region 118 and the third semiconductor region 110. The second gate structure 134 is connected to the cathode 130, and the second gate structure 134 is disposed over an interval between the second N-type semiconductor region 108 and the third semiconductor region 110. The junction 190 between N-type well region 104 and the P-type well region 114 is located below the second gate structure 134.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The third isolation trench 122 is located between the first N-type semiconductor region 106 and the second P-type semiconductor region 118, and disposed in the N-type well region 104. The fourth isolation trench 124 is located between the second N-type semiconductor region 108 and the first P-type semiconductor region 116, and disposed in the P-type well region 114.

In one embodiment, a threshold voltage which triggers the latch up can be controlled by adding gate structures (such as, the first gate structure 132 and the second gate structure 134) and isolation trenches (such as, the first isolation trench 120, the second isolation trench 126, the third isolation trench 122 and the fourth isolation trench 124) to a silicon controlled rectifier.

Figure 2:
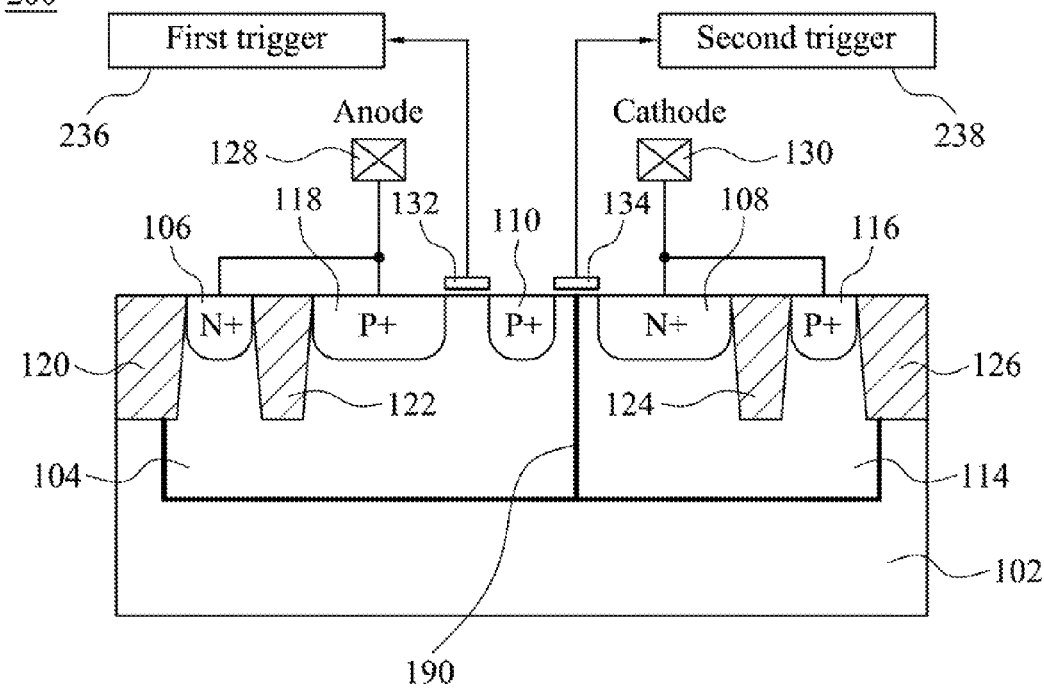
FIG. 2 is a schematic diagram of a gate-bounded silicon controlled rectifier according to a second embodiment of the present disclosure.

FIG. 2 is a schematic diagram of another type of a gate-bounded silicon controlled rectifier according to a second embodiment of the present disclosure. As shown in FIG. 2, a gate-bounded silicon controlled rectifier 200 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 110, a first isolation trench 120, a second isolation trench 126, a third isolation trench 122, a fourth isolation trench 124, an anode 128, a cathode 130, a first gate structure 132, a second gate structure 134, a first trigger 236 and a second trigger 238.

In the second embodiment of the present disclosure, the N-type well region 104 and the P-type well region 114 are disposed in the P-type substrate 102, and a junction 190 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 110 is located between the second N-type semiconductor region 108 and the second P-type semiconductor region 118, and disposed in the N-type well region 104. The third semiconductor region 110 represents a P-type semiconductor region.

In this embodiment, the first gate structure 132 is connected to the first trigger 236, and the first gate structure 132 is disposed over an interval between the second P-type semiconductor region 118 and the third semiconductor region 110. The second gate structure 134 is connected to the second trigger 238, and the second gate structure 134 is disposed over an interval between the second N-type semiconductor region 108 and the third semiconductor region 110. The junction 190 between the N-type well region 104 and the P-type well region 114 is located below the second gate structure 134.

The configuration of the first isolation trench 120, the second isolation trench 126, the third isolation trench 122 and the fourth isolation trench 124 in the second embodiment of the present disclosure are the same as the configuration of the corresponding structures illustrated in the first embodiment of the present disclosure, so this will not be repeated.

In one embodiment, a threshold voltage which triggers the latch up can be controlled by adding gate structures (such as, the first gate structure 132 and the second gate structure 134) and isolation trenches (such as, the first isolation trench 120, the second isolation trench 126, the third isolation trench 122 and the fourth isolation trench 124) to a silicon controlled rectifier.

Figure 3:
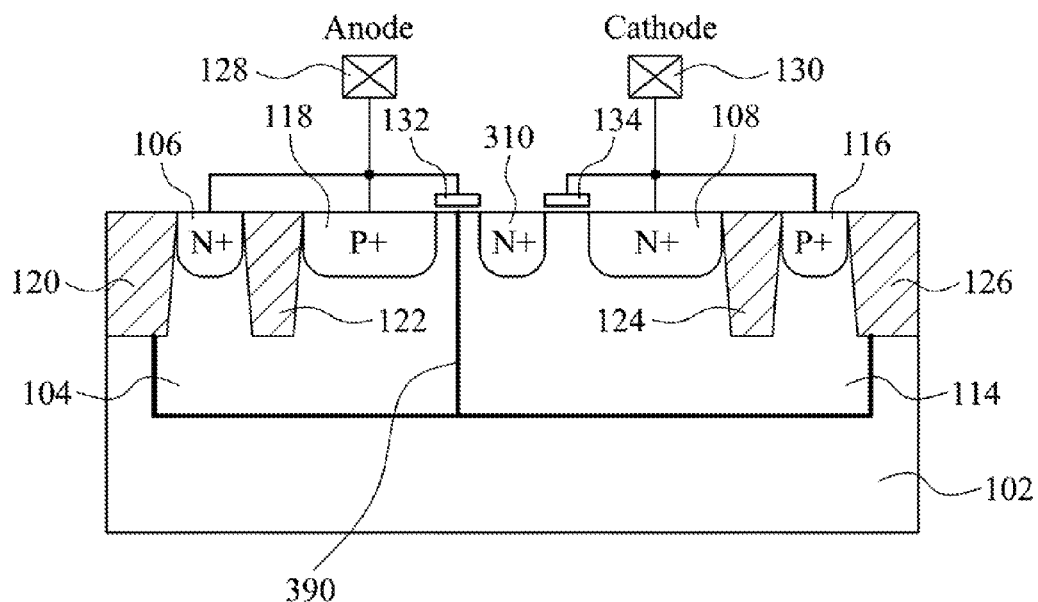
FIG. 3 is a schematic diagram of a gate-bounded silicon controlled rectifier according to a third embodiment of the present disclosure.

FIG. 3 is a schematic diagram of a gate-bounded silicon controlled rectifier according to a third embodiment of the present disclosure. As shown in FIG. 3, a gate-bounded silicon controlled rectifier 300 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 310, a first isolation trench 120, a second isolation trench 126, a third isolation trench 122, a fourth isolation trench 124, an anode 128, a cathode 130, a first gate structure 132 and a second gate structure 134.

In the third embodiment of the present disclosure, the N-type well region 104 and the P-type well region 114 are disposed in the P-type substrate 102, and a junction 390 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 310 is located between the second N-type semiconductor region 108 and the second P-type semiconductor region 118, and disposed in the P-type well region 114. The third semiconductor region 310 represents an N-type semiconductor region.

In this embodiment, the first gate structure 132 is connected to the anode 128, and the first gate structure 132 is disposed over an interval between the second P-type semiconductor region 118 and the third semiconductor region 310. The junction 390 between the N-type well region 104 and the P-type well region 114 is located below the first gate structure 132. The second gate structure 134 is connected to the cathode 130, and the second gate structure 134 is disposed over an interval between the second N-type semiconductor region 108 and the third semiconductor region 310.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The third isolation trench 122 is located between the first N-type semiconductor region 106 and the second P-type semiconductor region 118, and disposed in the N-type well region 104. The fourth isolation trench 124 is located between the second N-type semiconductor region 108 and the first P-type semiconductor region 116, and disposed in the P-type well region 114.

In one embodiment, a threshold voltage which triggers the latch up can be controlled by adding gate structures (such as, the first gate structure 132 and the second gate structure 134) and isolation trenches (such as, the first isolation trench 120, the second isolation trench 126, the third isolation trench 122 and the fourth isolation trench 124) to a silicon controlled rectifier.

Figure 4:
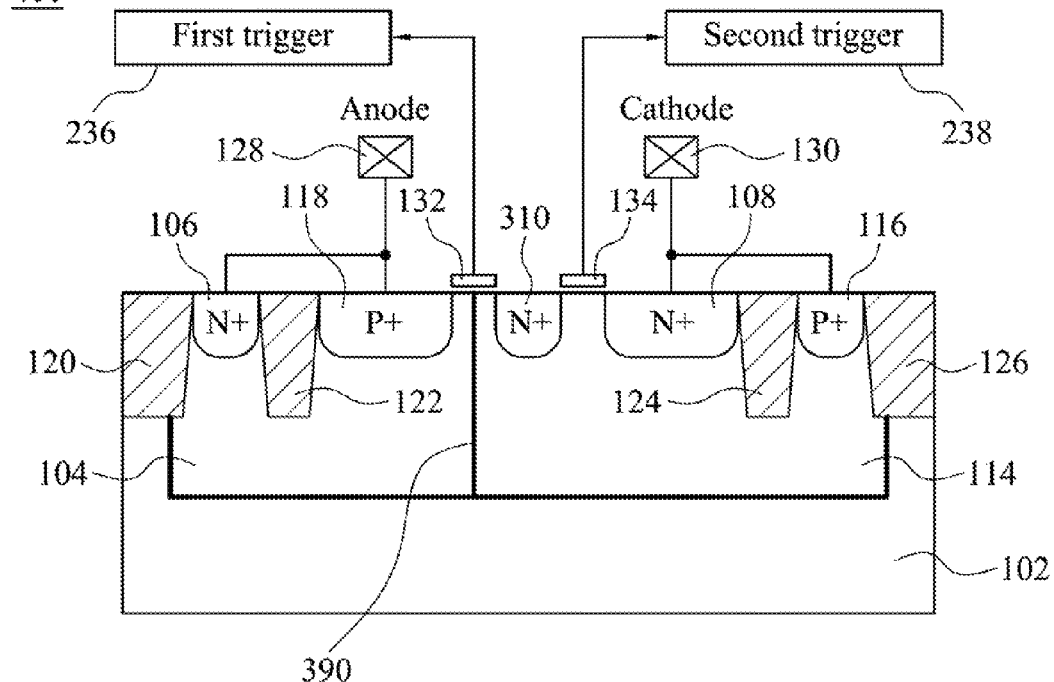
FIG. 4 is a schematic diagram of a gate-bounded silicon controlled rectifier according to a fourth embodiment of the present disclosure.

FIG. 4 is a schematic diagram of a gate-bounded silicon controlled rectifier according to a fourth embodiment of the present disclosure. As shown in FIG. 4, a gate-bounded silicon controlled rectifier 400 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 310, a first isolation trench 120, a second isolation trench 126, a third isolation trench 122, a fourth isolation trench 124, an anode 128, a cathode 130, a first gate structure 132, a second gate structure 134, a first trigger 236 and a second trigger 238.

In the fourth embodiment of the present disclosure, the N-type well region 104 and the P-type well region 114 are disposed in the P-type substrate 102, and a junction 390 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 310 is located between the second N-type semiconductor region 108 and the second P-type semiconductor region 118, and disposed in the N-type well region 104. The third semiconductor region 310 represents an N-type semiconductor region.

In this embodiment, the first gate structure 132 is connected to the first trigger 236, and the first gate structure 132 is disposed over an interval between the second P-type semiconductor region 118 and the third semiconductor region 310. The junction 390 between the N-type well region 104 and the P-type well region 114 is located below the first gate structure 132. The second gate structure 134 is connected to the second trigger 238, and the second gate structure 134 is disposed over an interval between the second N-type semiconductor region 108 and the third semiconductor region 310.

The configuration of the first isolation trench 120, the second isolation trench 126, the third isolation trench 122 and the fourth isolation trench 124 in the fourth embodiment of the present disclosure are the same as the configuration of the corresponding structures illustrated in the third embodiment of the present disclosure, so this will not be repeated.

In one embodiment, a threshold voltage which triggers the latch up can be controlled by adding gate structures (such as, the first gate structure 132 and the second gate structure 134) and isolation trenches (such as, the first isolation trench 120, the second isolation trench 126, the third isolation trench 122 and the fourth isolation trench 124) to a silicon controlled rectifier.

Figure 5:
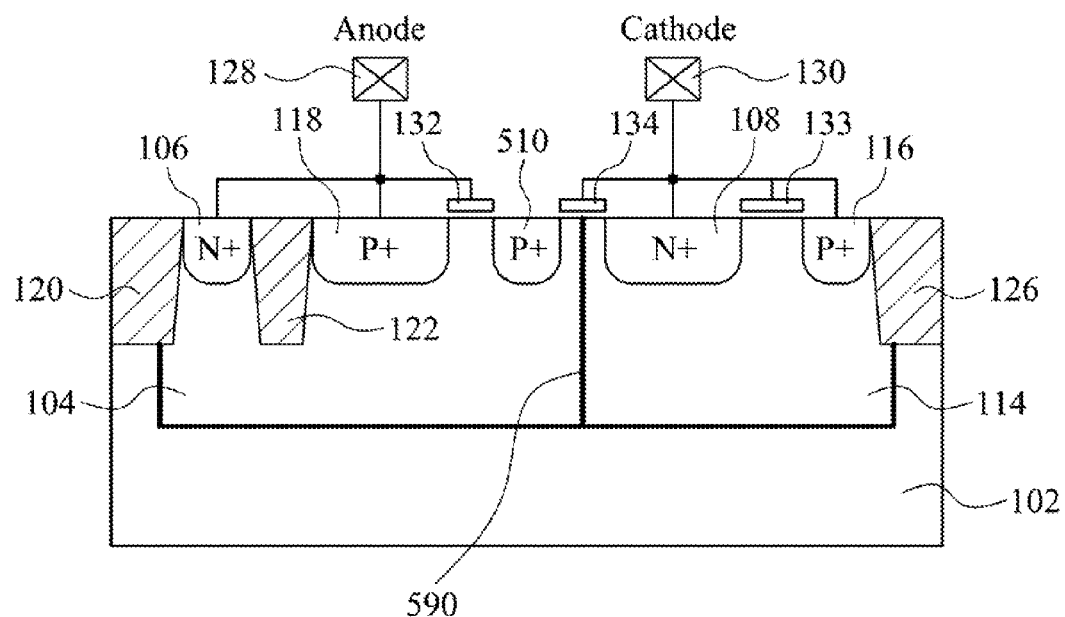
FIG. 5 is a schematic diagram of a gate-bounded silicon controlled rectifier according to a fifth embodiment of the present disclosure.

FIG. 5 is a schematic diagram of a gate-bounded silicon controlled rectifier according to a fifth embodiment of the present disclosure. As shown in FIG. 5, a gate-bounded silicon controlled rectifier 500 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 510, a first isolation trench 120, a second isolation trench 126, a third isolation trench 122, an anode 128, a cathode 130, a first gate structure 132, a second gate structure 134 and a third gate structure 133.

In the fifth embodiment of the present disclosure, the N-type well region 104 and the P-type well region 114 are disposed in the P-type substrate 102, a junction 590 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 510 is located between the second N-type semiconductor region 108 and the second P-type semiconductor region 118, and disposed in the N-type well region 104. The third semiconductor region 510 represents a P-type semiconductor region.

In this embodiment, the first gate structure 132 is connected to the anode 128, and the first gate structure 132 is disposed aver an interval between the second P-type semiconductor region 118 and the third semiconductor region 510. The second gate structure 134 is connected to the cathode 130, and the second gate structure 134 is disposed over an interval between the second N-type semiconductor region 108 and the third semiconductor region 510. The junction 590 between N-type well region 104 and the P-type well region 114 is located below the second gate structure 134. The third gate structure 133 is connected to the cathode 130, and the third gate structure 133 is disposed over an interval between the second N-type semiconductor region 108 and the first P-type semiconductor region 116.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The third isolation trench 122 is located between the first N-type semiconductor region 106 and the second P-type semiconductor region 118, and disposed in the N-type well region 104.

In one embodiment, a threshold voltage which triggers the latch up can be controlled by adding gate structures (such as, the first gate structure 132, the second gate structure 134 and the third gate structure 133) and isolation trenches (such as, the first isolation trench 120, the second isolation trench 126 and the third isolation trench 122) to a silicon controlled rectifier.

Figure 6:
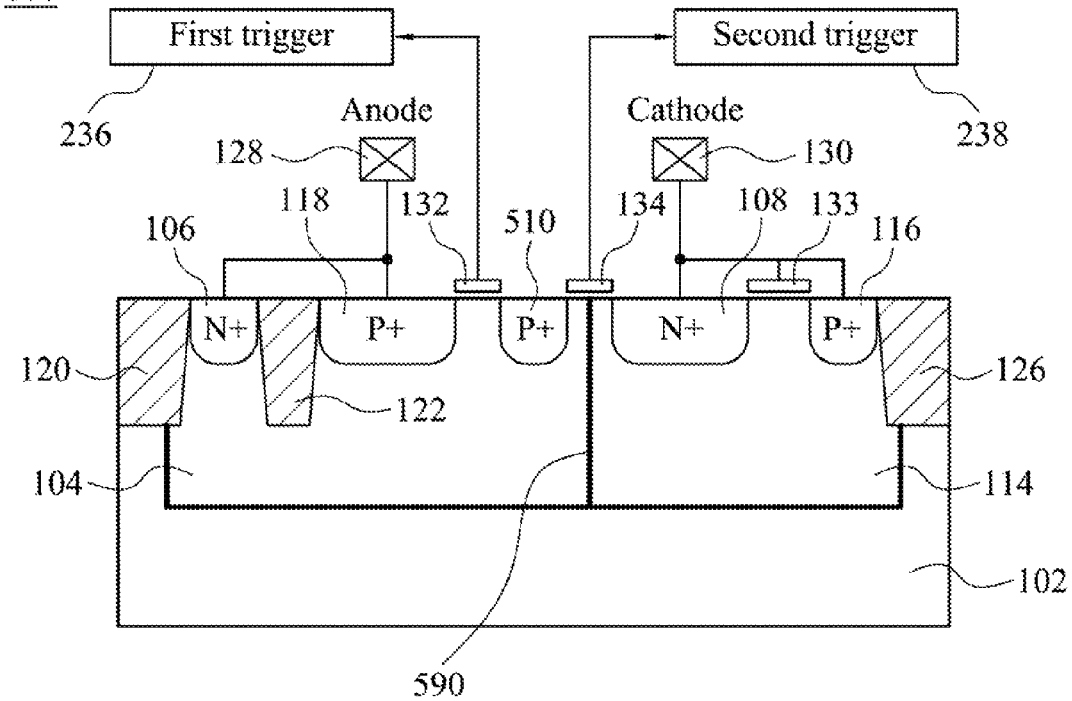
FIG. 6 is a schematic diagram of a gate-bounded silicon controlled rectifier according to a sixth embodiment of the present disclosure.

FIG. 6 is a schematic diagram of a gate-bounded silicon controlled rectifier according to a sixth embodiment of the present disclosure. As shown in FIG. 6, a gate-bounded silicon controlled rectifier 600 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 510, a first isolation trench 120, a second isolation trench 126, a third isolation trench 122, an anode 128, a cathode 130, a first gate structure 132, a second gate structure 134, a third gate structure 133, a first trigger 236 and a second trigger 238.

In the sixth embodiment of the present disclosure, the N-type well region 104 and the P-type well region 114 are disposed in the P-type substrate 102, and junction 590 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 510 is located between the second N-type semiconductor region 108 and the second P-type semiconductor region 118, and disposed in the N-type well region 104. The third semiconductor region 510 represents a P-type semiconductor region.

In this embodiment, the first gate structure 132 is connected to the first trigger 236, and the first gate structure 132 is disposed over an interval between the second P-type semiconductor region 118 and the third semiconductor region 510. The second gate structure 134 is connected to the second trigger 238, and the second gate structure 134 is disposed over an interval between the second N-type semiconductor region 108 and the third semiconductor region 510. The junction 590 between the N-type well region 104 and the P-type well region 114 is located below the second gate structure 134. The third gate structure 133 is connected to the cathode 130, and the third gate structure 133 is disposed over an interval between the second N-type semiconductor region 108 and the first P-type semiconductor region 116.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The third isolation trench 122 is located between the first N-type semiconductor region 106 and the second P-type semiconductor region 118, and disposed in the N-type well region 104.

In one embodiment, a threshold voltage which triggers the latch up can be controlled by adding gate structures (such as, the first gate structure 132, the second gate structure 134 and the third gate structure 133) and isolation trenches (such as, the first isolation trench 120, the second isolation trench 126 and the third isolation trench 122) to a silicon controlled rectifier.

Figure 7:
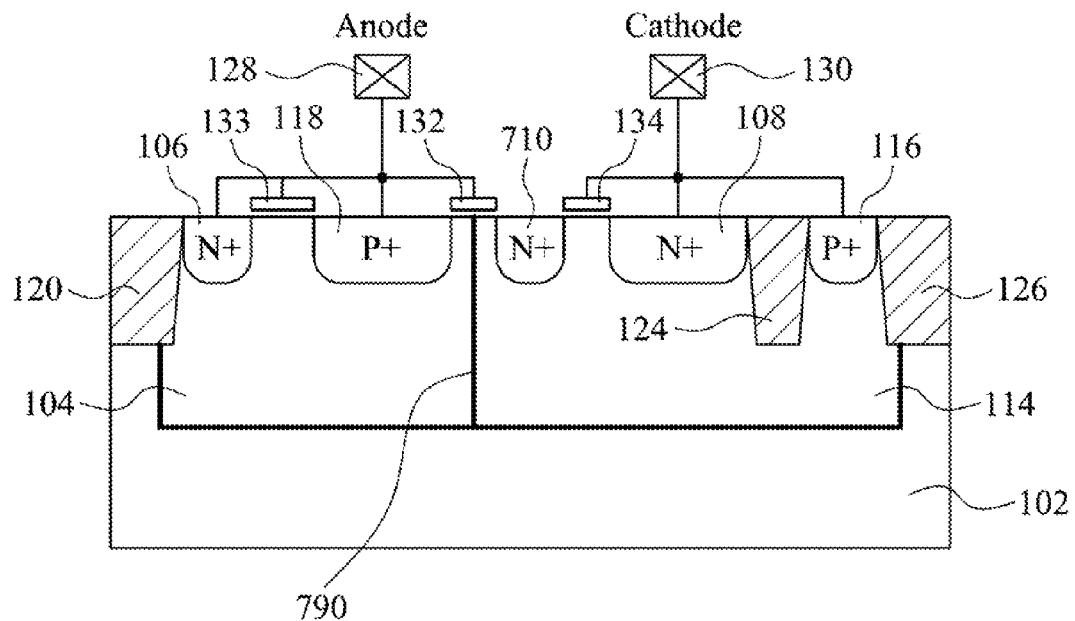
FIG. 7 is a schematic diagram of a gate-bounded silicon controlled rectifier according to a seventh embodiment of the present disclosure.

FIG. 7 is a schematic diagram of a gate-bounded silicon controlled rectifier according to a seventh embodiment of the present disclosure. As shown in FIG. 7, a gate-bounded silicon controlled rectifier 700 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 710, a first isolation trench 120, a second isolation trench 126, a fourth isolation trench 124, an anode 128, a cathode 130, a first gate structure 132, a second gate structure 134 and a third gate structure 133.

In the seventh embodiment of the present disclosure, the N-type well region 104 and the P-type well region 114 are disposed in the P-type substrate 102, and a junction 790 is located between the N-type well region 104 and the P-type well region 114. The first N-type semiconductor region 106 is connected to the anode 128; and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 710 is located between the second N-type semiconductor region 108 and the second P-type semiconductor region 118, and disposed in the P-type well region 114. The third semiconductor region 710 represents an N-type semiconductor region.

In this embodiment, the first gate structure 132 is connected to the anode 128, and the first gate structure 132 is disposed over an interval between the second P-type semiconductor region 118 and the third semiconductor region 710. The junction 790 between the N-type well region 104 and the P-type well region 114 is located below the first gate structure 132. The second gate structure 134 is connected to the cathode 130, and the second gate structure 134 is disposed over an interval between the second N-type semiconductor region 108 and the third semiconductor region 710. The third gate structure 133 is connected to the anode 128, and the third gate structure 133 is disposed over an interval between the first N-type semiconductor region 106 and the second P-type semiconductor region 118.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The fourth isolation trench 124 is located between the second N-type semiconductor region 108 and the first P-type semiconductor region 116, and disposed in the P-type well region 114.

In one embodiment, a threshold voltage which triggers the latch up can be controlled by adding gate structures (such as, the first gate structure 132, the second gate structure 134 and the third gate structure 133) and isolation trenches (such as, the first isolation trench 120, the second isolation trench 126 and the fourth isolation trench 124) to a silicon controlled rectifier.

Figure 8:
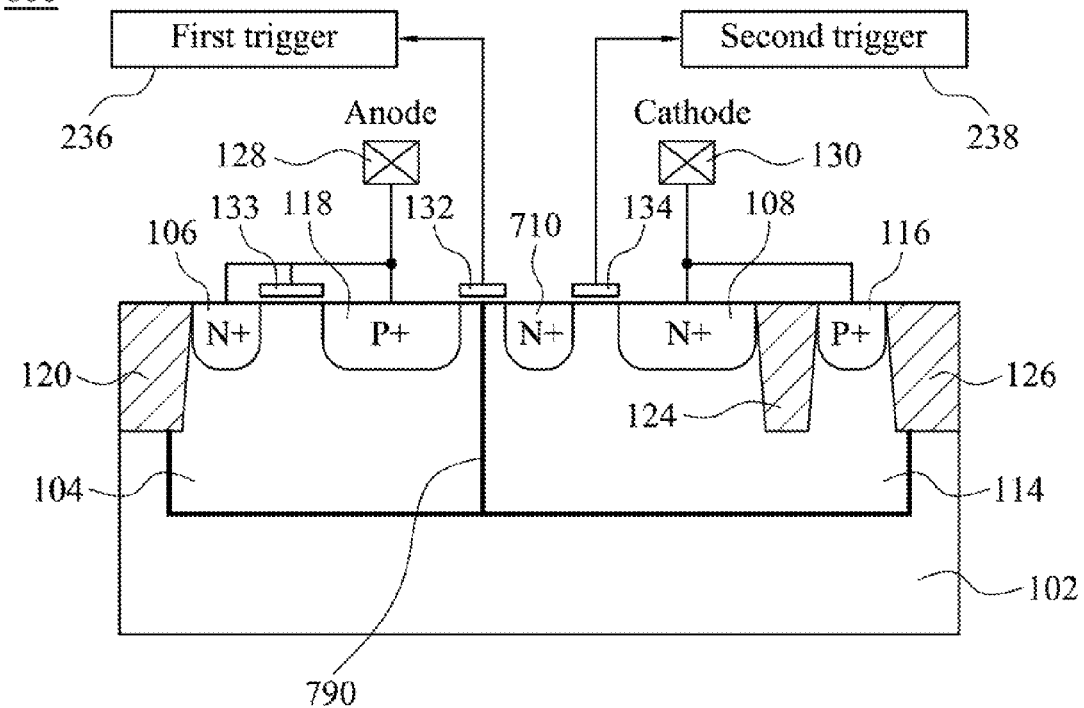
FIG. 8 is a schematic diagram of a gate-bounded silicon controlled rectifier according to an eighth embodiment of the present disclosure.

FIG. 8 is a schematic diagram of a gate-bounded silicon controlled rectifier according to an eighth embodiment of the present disclosure. As shown in FIG. 8, a gate-bounded silicon controlled rectifier 800 includes a P-type substrate 102, an N-type well region 104, a P-type well region 114, a first N-type semiconductor region 106, a first P-type semiconductor region 116, a second N-type semiconductor region 108, a second P-type semiconductor region 118, a third semiconductor region 710, a first isolation trench 120, a second isolation trench 126, a fourth isolation trench 124, an anode 128, a cathode 130, a first gate structure 132, a second gate structure 134, a third gate structure 133, a first trigger 236 and a second trigger 238.

In the eighth embodiment of the present disclosure, the N-type well region 104 and the P-type well region 114 are disposed in the P-type substrate 02, and a junction 790 is located between the N-type well region 104 and the P-type well region 114. The first N-type semiconductor region 106 is connected to the anode 128, and the first N-type semiconductor region 106 is disposed in the N-type well region 104. The first P-type semiconductor region 116 is connected to the cathode 130, and the first P-type semiconductor region 116 is disposed in the P-type well region 114. The second N-type semiconductor region 108 is connected to the cathode 130, and the second N-type semiconductor region 108 is disposed in the P-type well region 114 and located between the first N-type semiconductor region 106 and the first P-type semiconductor region 116. The second P-type semiconductor region 118 is connected to the anode 128, and the second P-type semiconductor region 118 is disposed in the N-type well region 104 and located between the first N-type semiconductor region 106 and the first P-type semiconductor region 116. The third semiconductor region 710 is located between the second N-type semiconductor region 108 and the second P-type semiconductor region 118, and disposed in the P-type well region 114. The third semiconductor region 710 represents an N-type semiconductor region.

In this embodiment, the first gate structure 132 is connected to the first trigger 236 and the first gate structure 132 is disposed over an interval between the second P-type semiconductor region 118 and the third semiconductor region 710. The junction 790 between the N-type well region 104 and the P-type well region 114 is located below the first gate structure 132. The second gate structure 134 is connected to the second trigger 238, and the second gate structure 134 is disposed over an interval between the second N-type semiconductor region 108 and the third semiconductor region 710. The third gate structure 133 is connected to the anode 128, and the third gate structure 133 is disposed over an interval between the first N-type semiconductor region 106 and the second P-type semiconductor region 118.

The first isolation trench 120 is located between the P-type substrate 102 and the first N-type semiconductor region 106, and disposed in a junction between the P-type substrate 102 and the N-type well region 104. The second isolation trench 126 is located between the P-type substrate 102 and the first P-type semiconductor region 116, and disposed in a junction between the P-type substrate 102 and the P-type well region 114. The fourth isolation trench 124 is located between the second N-type semiconductor region 108 and the first P-type semiconductor region 116, and disposed in the P-type well region 114.

In one embodiment, a threshold voltage which triggers the latch up can be controlled by adding gate structures (such as, the first gate structure 132, the second gate structure 134 and the third gate structure 133) and isolation trenches (such as, the first isolation trench 120, the second isolation trench 126 and the fourth isolation trench 124) to a silicon controlled rectifier.

In the embodiment mentioned above, the gate-bounded silicon controlled rectifier disclosed in the present disclosure controls the occurrence of the latch up by integrating the silicon controlled rectifier with the gate structures and the isolation trenches, and further reduces an equivalent distance between the anode and the cathode by connecting the first N-type semiconductor region and the second P-type semiconductor region in the N-type well region with the anode and by connecting the first P-type semiconductor region and the second N-type semiconductor region in the P-type well region with the cathode. Controlling the latch up for the rectifier and remaining the function of the electrostatic protection can be considered simultaneously by the technology of the present disclosure.

It will be apparent to those skilled in the art that various modifications and variations can be made to the structure of the present disclosure without departing from the scope or spirit of the present disclosure. In view of the foregoing, it is intended that the present invention cover modifications and variations of this present disclosure provided they fall within the scope of the following claims.

What is claimed is:

1. A gate-bounded silicon controlled rectifier, comprising:
    a substrate;
    an N-type well region, disposed in the substrate;
    a P-type well region, disposed in the substrate, wherein a junction is located between the P-type well region and the N-type well region;
    a first N-type semiconductor region, connected to a first pin, wherein the first N-type semiconductor region is disposed in the N-type well region;
    a first P-type semiconductor region, connected to a second pin, wherein the first P-type semiconductor region is disposed in the P-type well region;
    a second N-type semiconductor region, connected to the second pin, wherein the second N-type semiconductor region is disposed in the P-type well region and located between the first N-type semiconductor region and the first P-type semiconductor region;
    a second P-type semiconductor region, connected to the first pin, wherein the second P-type semiconductor region is disposed in the N-type well region and located between the first N-type semiconductor region and the first P-type semiconductor region; and
    a third semiconductor region, located between the second N-type semiconductor region and the second P-type semiconductor region,
    wherein the first pin and the second pin are respectively connected to an anode and a cathode.

2. The gate-bounded silicon controlled rectifier of claim 1, wherein the gate-bounded silicon controlled rectifier further comprises:
    a first gate structure, connected to a third pin, wherein the first gate structure is disposed over an interval between the second P-type semiconductor region and the third semiconductor region; and
    a second gate structure, connected to a fourth pin, wherein the second gate structure is disposed over an interval between the second N-type semiconductor region and the third semiconductor region, and the junction between the N-type well region and the P-type well region is located below the second gate structure,
    wherein the third pin is connected to the anode or to a first trigger, the fourth pin is connected to the cathode or to a second trigger, the substrate comprises a P-type substrate, the third semiconductor region comprises a P-type semiconductor region, and the third semiconductor region is disposed in the N-type well region.

3. The gate-bounded silicon controlled rectifier of claim 2, wherein the gate-bounded silicon controlled rectifier further comprises:
    a first isolation trench, located between the substrate and the first N-type semiconductor region, and disposed in a junction between the substrate and the N-type well region;
    a second isolation trench, located between the substrate and the first P-type semiconductor region, and disposed in a junction between the substrate and the P-type well region;
    a third isolation trench, located between the first N-type semiconductor region and the second P-type semiconductor region, and disposed in the N-well region; and
    a fourth isolation trench, located between the second N-type semiconductor region and the first P-type semiconductor region, and disposed in the P-type well region.

4. The gate-bounded silicon controlled rectifier of claim 1, wherein the gate-bounded silicon controlled rectifier further comprises:
    a first gate structure, connected to a third pin, wherein the first gate structure is disposed over an interval between the second P-type semiconductor region and the third semiconductor region, and the junction between the N-type well region and the P-type well region is located below the first gate structure; and
    a second gate structure, connected to a fourth pin, wherein the second gate structure is disposed over an interval between the second N-type semiconductor region and the third semiconductor region,
    wherein the third pin is connected to the anode or to a first trigger, the fourth pin is connected to the cathode or to a second trigger, the substrate comprises a P-type substrate, the third semiconductor region comprises an N-type semiconductor region, and the third semiconductor region is disposed in the P-type well region.

5. The gate-bounded silicon controlled rectifier of claim 4, wherein the gate-bounded silicon controlled rectifier further comprises:
    a first isolation trench, located between the substrate and the first N-type semiconductor region, and disposed in a junction between the substrate and the N-type well region;
    a second isolation trench, located between the substrate and the first P-type semiconductor region, and disposed in a junction between the substrate and the P-type well region;
    a third isolation trench, located between the first N-type semiconductor region and the second P-type semiconductor region, and disposed in the N-well region; and
    a fourth isolation trench, located between the second N-type semiconductor region and the first P-type semiconductor region, and disposed in the P-type well region.

6. The gate-bounded silicon controlled rectifier of claim 1, wherein the gate-bounded silicon controlled rectifier further comprises:
- a first gate structure, connected to a third pin, wherein the first gate structure is disposed over an interval between the second P-type semiconductor region and the third semiconductor region; and
- a second gate structure, connected to a fourth pin, wherein the second gate structure is disposed over an interval between the second N-type semiconductor region and the third semiconductor region, and the junction between the N-type well region and the P-type well region is located below the second gate structure,
- wherein the third pin is connected to the anode or to a first trigger, the fourth pin is connected to the cathode or to a second trigger, the substrate comprises a P-type substrate, the third semiconductor region comprises a P-type semiconductor region, and the third semiconductor region is disposed in the N-type well region.

7. The gate-bounded silicon controlled rectifier of claim 6, wherein the gate-bounded silicon controlled rectifier further comprises:
- a third gate structure, connected to the second pin, and the third structure is disposed over an interval between the second N-type semiconductor region and the first P-type semiconductor region;
- a first isolation trench, located between the substrate and the first N-type semiconductor region, and disposed in a junction between the substrate and the N-type well region;
- a second isolation trench, located between the substrate and the first P-type semiconductor region, and disposed in a junction between the substrate and the P-type well region; and
- a third isolation trench, located between the first N-type semiconductor region and the second P-type semiconductor region, and disposed in the N-well region.

8. The gate-bounded silicon controlled rectifier of claim 1, wherein the gate-bounded silicon controlled rectifier further comprises:
- a first gate structure, connected to a third pin, wherein the first gate structure is disposed over an interval between the second P-type semiconductor region and the third semiconductor region, and the junction between the N-type well region and the P-type well region is located below the first gate structure; and
- a second gate structure, connected to a fourth pin, wherein the second gate structure is disposed over an interval between the second N-type semiconductor region and the third semiconductor region,
- wherein the third pin is connected to the anode or to a first trigger, the fourth pin is connected to the cathode or to a second trigger, the substrate comprises a P-type substrate, the third semiconductor region comprises an N-type semiconductor region, and the third semiconductor region is disposed in the P-type well region.

9. The gate-bounded silicon controlled rectifier of claim 8, wherein the gate-bounded silicon controlled rectifier further comprises:
- a third gate structure, connected to the first pin, and the third structure is disposed over an interval between the first N-type semiconductor region and the second P-type semiconductor region;
- a first isolation trench, located between the substrate and the first N-type semiconductor region, and disposed in a junction between the substrate and the N-type well region;
- a second isolation trench, located between the substrate and the first P-type semiconductor region, and disposed in a junction between the substrate and the P-type well region; and
- a third isolation trench, located between the second N-type semiconductor region and the first P-type semiconductor region, and disposed in the P-well region.

* * * * *